US012270647B2

(12) United States Patent
Jansen et al.

(10) Patent No.: US 12,270,647 B2
(45) Date of Patent: Apr. 8, 2025

(54) METHOD FOR CALIBRATION OF AN OPTICAL MEASUREMENT SYSTEM AND OPTICAL MEASUREMENT SYSTEM (71) Applicant: ASML Netherlands B.V., Veldhoven (NL)

(72) Inventors: Maarten Jozef Jansen, Casteren (NL); Ping Liu, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 230 days.

(21) Appl. No.: 17/920,751

(22) PCT Filed: Mar. 22, 2021

(86) PCT No.: PCT/EP2021/057292
§ 371 (c)(1),
(2) Date: Oct. 21, 2022

(87) PCT Pub. No.: WO2021/213750
PCT Pub. Date: Oct. 28, 2021

(65) Prior Publication Data
US 2023/0168077 A1 Jun. 1, 2023

(30) Foreign Application Priority Data
Apr. 23, 2020 (EP) .................... 20171037

(51) Int. Cl.
*G01B 9/02055* (2022.01)
*G01B 9/02001* (2022.01)
(Continued)

(52) U.S. Cl.
CPC ..... *G01B 9/02072* (2013.04); *G01B 9/02003* (2013.01); *G01B 9/02004* (2013.01);
(Continued)

(58) Field of Classification Search
CPC ............ G01B 9/02072; G01B 9/02003; G01B 9/02004; G01B 9/02007; G01B 9/02027;
(Continued)

(56) References Cited

U.S. PATENT DOCUMENTS 6,020,964 A 2/2000 Loopstra et al.
6,137,574 A * 10/2000 Hill .................... G01B 9/02083
356/486
(Continued)

FOREIGN PATENT DOCUMENTS

CN 102955377 B 3/2013
JP 2002-543373 A 12/2002
(Continued)

OTHER PUBLICATIONS

International Search Report and Written Opinion of the International Searching Authority directed to related International Patent Application No. PCT/EP2021/057292, mailed May 31, 2021; 11 pages.

*Primary Examiner* — Dominic J Bologna
(74) *Attorney, Agent, or Firm* — Sterne, Kessler, Goldstein & Fox P.L.L.C.

(57) ABSTRACT

The invention provides a method for calibration of an optical measurement system, which may be a heterodyne interferometer system, wherein a first optical axis and a second optical axis have a different optical path length, the method comprises: °measuring a first measurement value along the first optical axis using a first measurement beam, °measuring a second measurement value along the second optical axis using a second measurement beam, °changing a wavelength of the first measurement beam and the second measurement beam, °measuring a further first measurement value along the first optical axis using the first measurement beam with changed wavelength, measuring a further second measurement value along the second optical axis using the second (Continued)

measurement beam with changed wavelength, °determining a cyclic error of the optical measurement system on the basis of the measured values, and °storing a corrective value based on the cyclic error.

20 Claims, 5 Drawing Sheets

(51) Int. Cl.
*G01B 9/02003* (2022.01)
*G01B 9/02004* (2022.01)
*G01B 9/02015* (2022.01)
*G01B 9/02056* (2022.01)
*G03F 7/00* (2006.01)

(52) U.S. Cl.
CPC ..... *G01B 9/02007* (2013.01); *G01B 9/02027* (2013.01); *G01B 9/02059* (2013.01); *G03F 7/70516* (2013.01); *G03F 7/70775* (2013.01)

(58) Field of Classification Search
CPC ............. G01B 9/02059; G03F 7/70516; G03F 7/70775
See application file for complete search history.

(56) References Cited

U.S. PATENT DOCUMENTS

| | | |
|---|---|---|
| 6,181,420 B1* | 1/2001 | Badami ............... G03F 7/70775 356/487 |
| 6,330,065 B1 | 12/2001 | Hill |
| 6,952,253 B2 | 10/2005 | Lof et al. |
| 8,937,707 B2 | 1/2015 | Jansen et al. |
| 11,287,242 B2 | 3/2022 | Jansen et al. |
| 2007/0008547 A1* | 1/2007 | Hill .................... G01B 9/02084 356/498 |
| 2007/0024860 A1 | 2/2007 | Tobiason et al. |
| 2007/0058172 A1* | 3/2007 | Van Der Pasch ... G03F 7/70775 356/521 |
| 2007/0058173 A1 | 3/2007 | Holzapfel |
| 2012/0212746 A1* | 8/2012 | Hatada ............... G01B 9/02004 356/498 |
| 2019/0025053 A1 | 1/2019 | Slotwinski et al. |
| 2019/0265019 A1 | 8/2019 | Jansen et al. |
| 2020/0356011 A1 | 11/2020 | Su et al. |

FOREIGN PATENT DOCUMENTS

| | | |
|---|---|---|
| JP | 2003-527577 A | 9/2003 |
| JP | 2011-038882 A | 2/2011 |
| JP | 2019-527357 A | 9/2019 |
| TW | 2019-21151 A | 6/2019 |
| WO | WO 2018/010961 A1 | 1/2018 |
| WO | WO 2019/149515 A1 | 8/2019 |

* cited by examiner

METHOD FOR CALIBRATION OF AN OPTICAL MEASUREMENT SYSTEM AND OPTICAL MEASUREMENT SYSTEM

CROSS-REFERENCE TO RELATED APPLICATIONS

This application claims priority of EP application 20171037.3 which was filed on Apr. 23, 2020 and which is incorporated herein in its entirety by reference.

FIELD

The present invention relates to a method for calibration of an optical measurement system and to an optical measurement system

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

The lithographic apparatus typically is provided with an optical position measurement system, such as an interferometer system. The interferometer system is arranged to accurately determine the position of an object, such as table holding the substrate or an optical component of the projection system. The position of such an object needs to be accurately measured, so that a control system can accurately move the object to a desired position. A measurement error of the interferometer causes the control system to move the object to a location at an offset of the desired position. Due to the offset, the pattern may not be projected properly on the substrate.

A disadvantage of the known interferometer system is that it suffers from so-called cyclic errors. The interferometer system provides a repetitive signal based on the position of the object. The cyclic errors are errors of the repetitive signal that depend on the phase of the signal.

US 2019/265019 discloses a method for calibration of an optical measurement system. This method comprises the steps of:
measuring, along a measuring direction, a first position or first angular orientation of a target;
determining a first cyclic error of the optical measurement system for when the target is at the first position or in the first angular orientation;
measuring, along the measuring direction, a second position or second angular orientation of the target;
determining a second cyclic error of the optical measurement system for when the target is at the second position or in the second angular orientation, wherein the second position is at a distance from the first position in a direction other than the measuring direction;
storing a first corrective value based on the first cyclic error; and
storing a second corrective value based on the second cyclic error.

The first corrective value and the second corrective value can be used to correct a measurement value of the optical measurement system with the first corrective value for when the target is at or near the first position, and to correct a further measurement value of the optical measurement system with the second corrective value for when the target is at or near the second position.

In the method of US 2019/265019 a moving target is required to determine a corrective value to correct a measurement value for cyclic errors.

A drawback of this method is that the method cannot be used to determine a cyclic error for an interferometer system that does not have a moving target.

SUMMARY

It is an object of the invention to provide a method for calibration of an optical measuring system that does not require a moving target to determine a corrective value to correct a measuring value of the optical measuring system for cyclic errors. It is another object of the invention to provide an optical measurement system arranged to correct for cyclic errors without the need of a moving target to determine the corrective value used for correction of the cyclic errors.

According to an aspect of the invention there is provided a method for calibration of an optical measurement system comprising a first optical axis and a second optical axis, wherein the first optical axis and second optical axis have a different optical path length, the method comprising calibration steps:
measuring a first measurement value along the first optical axis using a first measurement beam,
measuring a second measurement value along the second optical axis using a second measurement beam,
changing a wavelength of the first measurement beam and the second measurement beam,
measuring a further first measurement value along the first optical axis using the first measurement beam with changed wavelength,
measuring a further second measurement value along the second optical axis using the second measurement beam with changed wavelength,
determining a cyclic error of the optical measurement system on the basis of the first measurement value, the second measurement value, the further first measurement value and the further second measurement value, and
storing a corrective value based on the cyclic error.

According to an aspect of the invention, there is provided an optical measurement system, comprising:

a light source to provide a first measurement beam and a second measurement beam, a first optical axis optically connected to the light source to receive the first measurement beam, a second optical axis optically connected to the lights source to receive the second measurement beam, wherein the first optical axis and second optical axis have a different optical path length, a first detector associated with the first optical axis, a second detector associated with the second optical axis, a processing unit connected to the first detector and the second detector, wherein the optical measurement system is arranged to carry out a calibration method, comprising the steps measuring with the first detector a first measurement value along the first optical axis using the first measurement beam, measuring with the second detector a second measurement value along the second optical axis using the second measurement beam, changing a wavelength of the first measurement beam and the second measurement beam, measuring with the first detector a further first measurement value along the first optical axis using the first measurement beam with changed wavelength, measuring with the second detector a further second measurement value along the second optical axis using the second measurement beam with changed wavelength, determining in the processing unit a cyclic error of the optical measurement system on the basis of the first measurement value, the second measurement value, the first further measurement value and the second further measurement value, and storing a corrective value based on the cyclic error.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
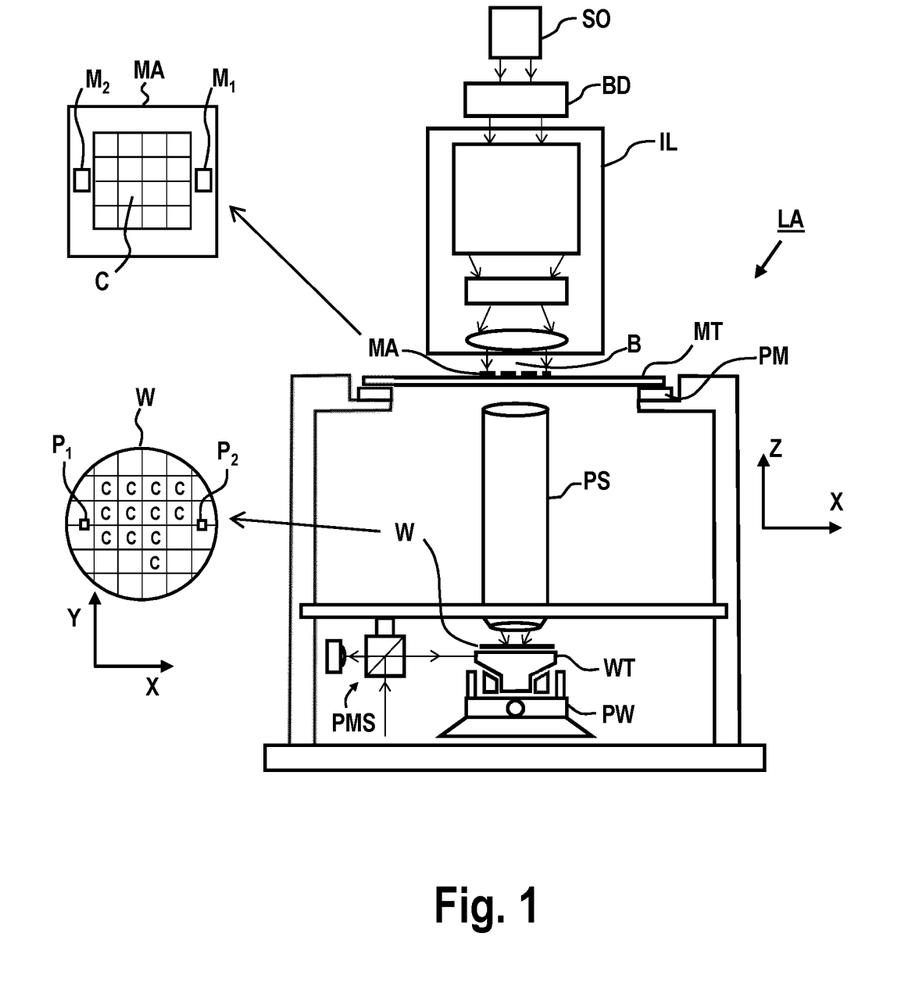
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
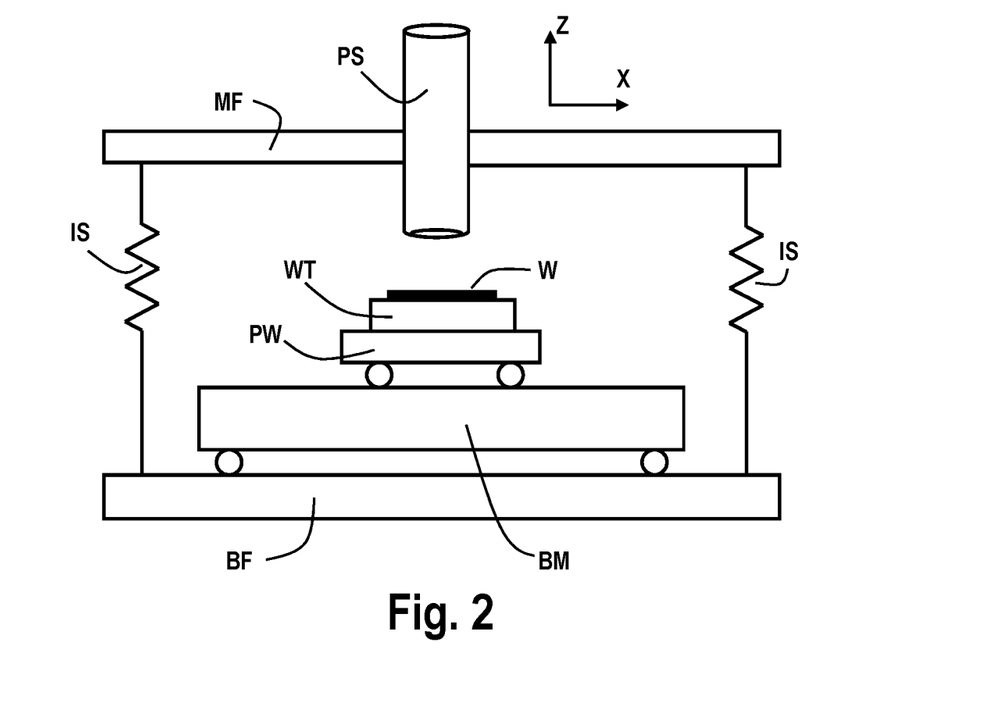
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electromagnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
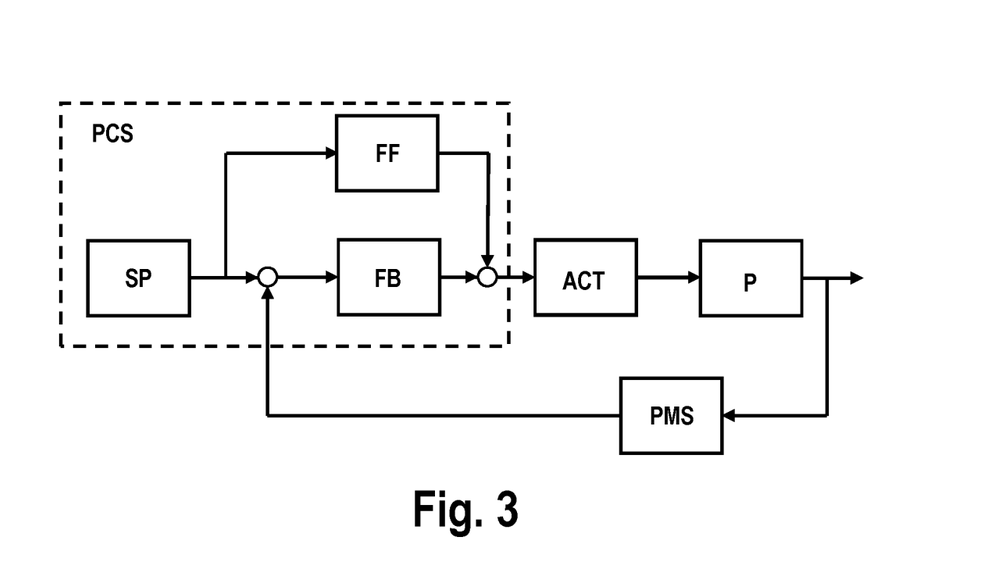
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

Figure 4:
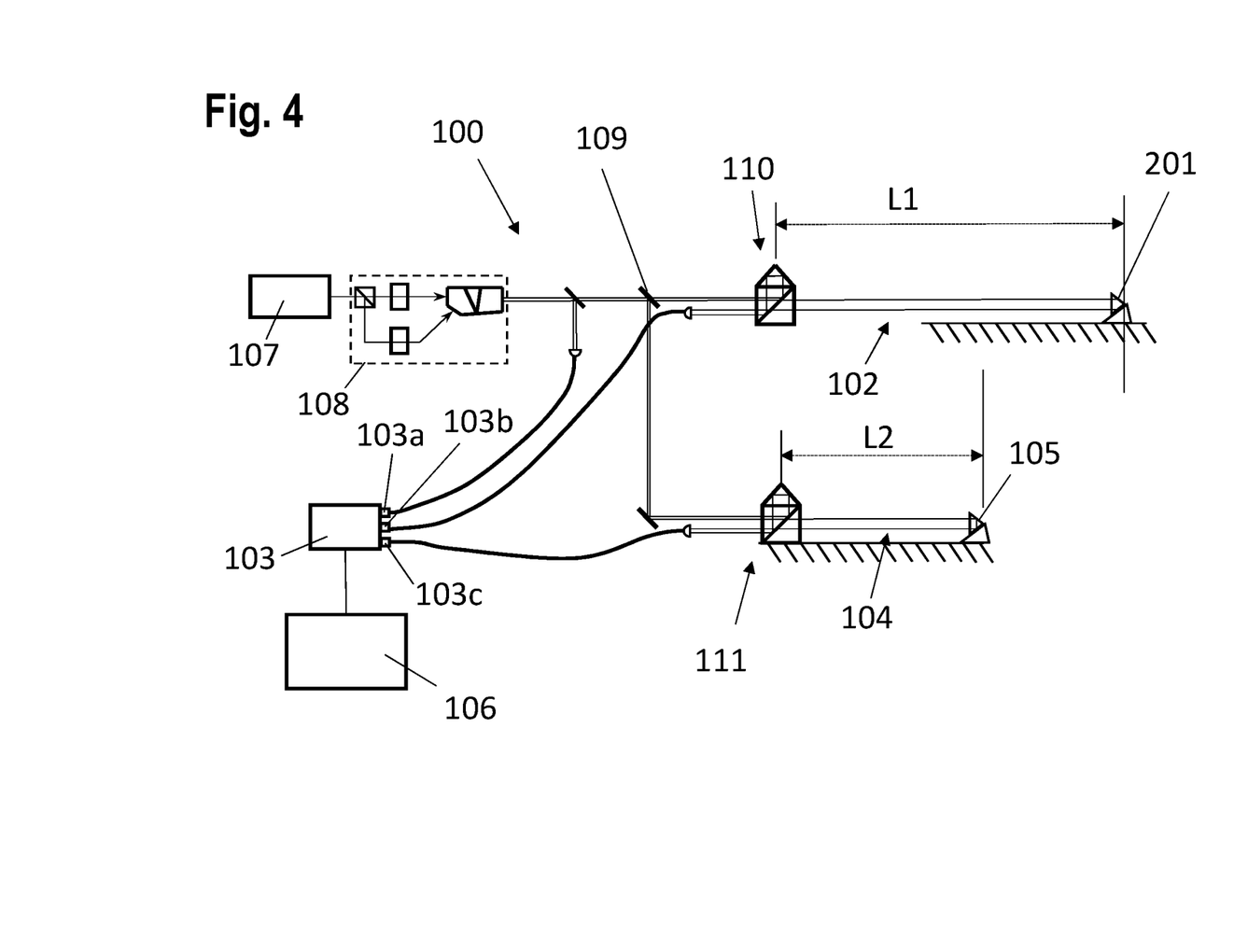
FIG. 4 depicts a first embodiment of an optical measurement system according to an embodiment of the invention.

FIG. 4 shows an embodiment of an interferometer system 100 according to an embodiment of the invention. The interferometer system 100 comprises a first optical axis 102 and a second optical axis 104. The interferometer system 100 is a heterodyne interferometer system and comprises a tunable laser device 107. The tunable laser device 107 is configured to provide a radiation beam with a tunable light frequency.

The interferometer system 100 comprises an optical system 108 associated with the tunable laser device 107. The optical system 108 is constructed to split the radiation beam into a first radiation beam part to be used as measurement beams in the first optical axis 102 and the second optical axis 104 and a second radiation beam part to be used as reference beams in the first optical axis 102 and the second optical axis 104.

In the optical system 108, a first optical frequency shift device is provided in the optical path of the first radiation beam part and a second optical frequency shift device is provided in the optical path of the second radiation beam part in order to create a frequency difference between a first frequency of the first radiation beam part and a second frequency of the second radiation beam part. The first and second optical frequency shift devices are for example acousto-optical modulator units that effectively create a frequency difference of for example 4 MHz between the first frequency of the first radiation beam part and the second frequency of the second radiation beam part. Other devices to create a frequency difference between the first beam and the second beam may also be applied. It is also possible that only in the first optical path or in the second optical path a frequency shift device is arranged to create the desired frequency difference between the first frequency of the first beam and the second frequency of the second beam. The first radiation beam part and the second radiation beam part are recombined in the optical system 108 in a recombined radiation beam with a tunable light frequency.

The recombined radiation beam with tunable light frequency is split, for example by a non-polarizing beam splitter 109, into a first part and a second part. The first part is directed to interferometer optics 110 associated with the first optical axis 102. The interferometer optics 110 are arranged to split the first part into a first measurement beam and a first reference beam. The first measurement beam is guided along the first optical path 102, to a first reflective measurement surface 201. After the first measurement beam is reflected by the first reflective measurement surface 201, the first measurement beam is recombined with the first reference beam in the interferometer optics 110. The recombined first measurement beam and first reference beam are directed to a detector 103b which is connected to a light sensor device 103.

The second part of the radiation beam is directed to interferometer optics 111 associated with the second optical axis 104. The interferometer optics 111 is arranged to split the second part into a second measurement beam and a second reference beam. The second measurement beam is guided along the second optical path 104 to a second reflective reference surface 105. After the second measurement beam is reflected by the second reflective reference surface 105, the second measurement beam is recombined with the second reference beam in the interferometer optics 111. The recombined second measurement beam and second reference beam are directed to a detector 103c which is connected to the light sensor 103.

The first optical axis 102 comprises a first optical path length L1 between the first measurement beam and the first reference beam and the second optical axis 104 comprises a second optical path length L2 between the second measurement beam and the second reference beam. The optical path length L1 of the first optical axis 102 is defined by a first reflective measurement surface 201 mounted at a fixed position with respect to the interferometer optics 110 and the optical path length L2 of the second optical axis 104 is defined by a second reflective measurement surface 105 mounted at a fixed position with respect to the interferometer optics 111. The first optical path length L1 and the second optical path length L2 are different. Since the first reflective measurement surface 201 and the second reflective measurement surface 105 are arranged in a fixed position, the first optical path length L1 and the second optical path length L2 are constant. As a result, there is a constant difference between the first optical path length L1 and the second optical path length L2.

Before the recombined radiation beam is split into the first part and the second part, a further part of the recombined radiation beam with tunable light frequency is directed to a reference detector 103a which is connected to the light sensor device 103. This part of the recombined radiation beam with tunable light frequency has not interacted with the first reflective measurement surface 201 or the second reflective reference surface 105 and is used as a reference signal for the processing of the measurements of the heterodyne interferometer system 100.

The reference detector 103a propagates the part of the laser beam onto a light diode of the light sensor device 103. The detector 103b propagates the recombined first measurement beam and first reference beam onto another light diode of the light sensor device 103. The detector 103c propagates the recombined second measurement beam and second reference beam onto yet another light diode of light sensor device 103. The measurements of the light diodes are fed via the light sensor device 103 into a processing unit 106. The processing unit 106 generates a first measurement value, i.e. a first measurement phase value, based on the input by the detector 103b. Alternatively, the processing unit 106 may generate the first measurement phase value based on the input by the detector 103b and the input by the reference detector 103a to compensate for disturbances of the laser beam between the tunable laser source 107 and the interferometer optics 110. The processing unit 106 generates a second measurement value, i.e. a second measurement phase value, based on the input by the detector 103c. Alternatively, the processing unit 106 may generate the second measurement value based on the input by the detector 103c and the input by the reference detector 103a to compensate for disturbances of the laser beam between tunable laser source 107 and the interferometer optics 111.

The interferometer system 100 depicted in FIG. 4 may suffer from so-called cyclic errors. The interferometer system 100 provides a repetitive signal based on the position of the first reflective measurement surface 201 and the second reflective reference surface 105. The cyclic errors are errors of the repetitive signal that depend on the phase of the signal. In this embodiment a calibration method is proposed to determine a corrective value that can be used to compensate for these cyclic errors. The processing unit 106 is arranged to carry out such calibration method.

The calibration method comprises the following steps:
measuring a first measurement value along the first optical axis 102 using the first measurement beam and measuring a second measurement value along the second optical axis 104 using a second measurement beam,
changing a wavelength of the first measurement beam and the second measurement beam by tuning of the frequency of the radiation beam provided by the tunable laser source 107,
measuring a further first measurement value along the first optical axis 102 using the first measurement beam with changed wavelength, and measuring a further second measurement value along the second optical axis 104 using the second measurement beam with changed wavelength.

On the basis of the first measurement value, the second measurement value, the further first measurement value and the further second measurement value a cyclic error of the optical measurement system can be determined.

This cyclic error can be used to determine a corrective value that can be stored in the processing unit 106, for example as a formula or lookup table, to compensate for the cyclic error during operational measurements of the interferometer system.

The calculation of the cyclic error is based on the effect that changing the frequency of the first measurement beam between measuring the first measurement value and the further first measurement value will result in a phase shift between the first measurement value and the further first measurement value, and changing the frequency of the second measurement beam between measuring the second measurement value and the further second measurement value will result in a phase shift between the second measurement value and the further second measurement value. The phase shift rate between the first optical axis 102 and the second optical axis 104 will scale with the optical path length difference between the first optical path length L1 and the second optical path length L2.

The difference in phase shift rate will affect the cyclic error period as a function of time and hence can be used to uniquely identify and determine the cyclic error for each optical axis 102, 104 from the first measurement value, the second measurement value, the further first measurement value and the further second measurement value.

In the described method above, only two measurements at two frequency levels are carried out. In practice, multiple further measurements may be carried out at different frequencies, for example by taking multiple measurements while the tunable laser source 107 provides a radiation beam with a frequency sweep in a suitable frequency range. Several hundreds or thousands of measurements may be taken. The measurement redundancy may guarantee a well-conditioned set of linear equations.

As a more detailed example, the cyclic error may be determined as follows.

In a first step, the change in measurement values of the first optical axis 102 and measurement values of the second optical axis 104 during wavelength change as described above is measured. This measurement results in a (column) vector containing measurement data from the first optical axis 102: ($\phi_{OPD_1}$(t)) and measurement data from the second optical axis 104: ($\phi_{OPD_2}$(t)). The change in measurement data of interferometer axes with a different optical path length difference (OPD) will have a very similar shape, but a different magnitude. The relative gain is equal to the length ratio of the measured cavities. In a second step, the measurement value trajectory as measured by both interferometers is fitted to each other, resulting in a gain which is corresponding to the OPD ratio $$\frac{OPD_1}{OPD_2}$$

between the first optical path length L1 of the first optical axis 102 and the second optical path length of the second optical axis 104.

Thus the first and second steps are used to estimate the OPD ratio. If the OPD ratio between the first optical axis 102 and the second optical axis 104 was already known prior to the measurement, then the first step and the second step may be skipped in the signal processing.

Now the OPD ratio is known and, in a third step, the fit residual containing the mixture of cyclic errors of both interferometer axes can be determined as follows:

$$\text{fit residual} = \left(\phi_{OPD_1} - \frac{OPD_1}{OPD_2} \cdot \phi_{OPD_2}\right).$$

The residuals mainly contain the difference between the cyclic errors of both interferometer axes.

In a fourth step, the cyclic errors can be fitted. As goal functions for fitting cyclic errors the cosine and the sine of the measured phase values of each optical axis can be used:

$$\text{residual} = \left(a_{1,1} \cdot \cos(\phi_{OPD_1}) + b_{1,1} \cdot \sin(\phi_{OPD_1}) + a_{2,1} \cdot \cos(2\phi_{OPD_1}) + b_{2,1} \cdot \sin(2\phi_{OPD_1})\right) - \frac{OPD_1}{OPD_2} \cdot \left(a_{1,2} \cdot \cos(\phi_{OPD_2}) + b_{1,2} \cdot \sin(\phi_{OPD_2}) + a_{2,2} \cdot \cos(2\phi_{OPD_2}) + b_{2,2} \cdot \sin(2\phi_{OPD_{1,2}})\right) + \text{offset}$$

wherein the parameters that can be fitted are:

| | |
|---|---|
| $a_{1,1}$ $b_{1,1}$ | $1^{st}$ harmonic cyclic error parameters for first optical axis |
| $a_{2,1}$ $b_{2,1}$ | $2^{nd}$ harmonic cyclic error parameters for first optical axis |
| $a_{1,2}$ $b_{1,2}$ | $1^{st}$ harmonic cyclic error parameters for second optical axis |
| $a_{2,2}$ $b_{2,2}$ | $2^{nd}$ harmonic cyclic error parameters for second optical axis |
| offset | Offset is an additional parameter that can be fitted |

This set of linear equations can for instance be solved when writing in matrix notation:

$$H = \left[\cos(\phi_{OPD_1}), \sin(\phi_{OPD_1}), \cos(2\phi_{OPD_1}), \sin(2\phi_{OPD_1}), \ldots -\frac{OPD_1}{OPD_2} \cdot \left[\cos(\phi_{OPD_2}), \sin(\phi_{OPD_2}), \cos(2\phi_{OPD_2}), \sin(2\phi_{OPD_2}), \ldots \text{ones}(\text{size}(\phi_{OPD_1}))\right]\right]$$

The columns of solving matrix H contain the goal functions that are fitted to the measurement residual. Basically any number of harmonics or extra goal functions, such as offset or trend, may be added to the matrix H, but in the example only the goal functions for the $1^{st}$ and $2^{nd}$ harmonic cyclic errors of both interferometer axes are fitted. A least squares fit of a set of linear equations can be obtained by:

$$\text{par} = (H^T \cdot H)^{-1} \cdot H^T \cdot \text{residual}$$

"par" now represents a vector that contains the fitted cyclic error parameters:

$[a_{1,1} \ b_{1,1} \ a_{2,1} \ b_{2,1} \ a_{1,2} \ b_{1,2} \ a_{2,2} \ b_{2,2} \ \text{offset}]^T$ During operational use of the interferometer system, the derived cyclic error parameters, i.e. the corrective values, can be used to reconstruct corrected measurement values of the interferometer system 100 without cyclic errors. The corrected phase signals can for example be reconstructed on the basis of the following equations:

$$\phi_{OPD_1,corrected} = \phi_{OPD_1} - (a_{1,1} \cdot \cos(\phi_{OPD_1}) + b_{1,1} \cdot \sin(\phi_{OPD_1}) + a_{2,1} \cdot \cos(2\phi_{OPD_1}) + b_{2,1} \cdot \sin(2\phi_{OPD_1}))$$

$$\phi_{OPD_2,corrected} = \phi_{OPD_2} - (a_{1,2} \cdot \cos(\phi_{OPD_2}) + b_{1,2} \cdot \sin(\phi_{OPD_2}) + a_{2,2} \cdot \cos(2\phi_{OPD_2}) + b_{2,2} \cdot \sin(2\phi_{OPD_2}))$$

Thus, the determined cyclic error can be used to calculate a corrective value that can be used to correct during operational use of the interferometer system 100 measurement for the cyclic error of the interferometer system.

The cyclic errors parameters, i.e. the corrective values, are typically stored in the processing unit 106 as a cyclic error correction lookup table or cyclic error correction formula which is used for inline cyclic error compensation during a measurement.

The method as described above provides the possibility to correct measurements of an interferometer system with fixed optical path length of both the first optical axis 102 and the second optical axis 104.

An advantage of the method is that cyclic error measurement is possible for arbitrary frequency tuning trajectories without any requirement on tuning rate or tuning smoothness, while an analytically exact solution for finding the cyclic error can be determined.

Figure 5:
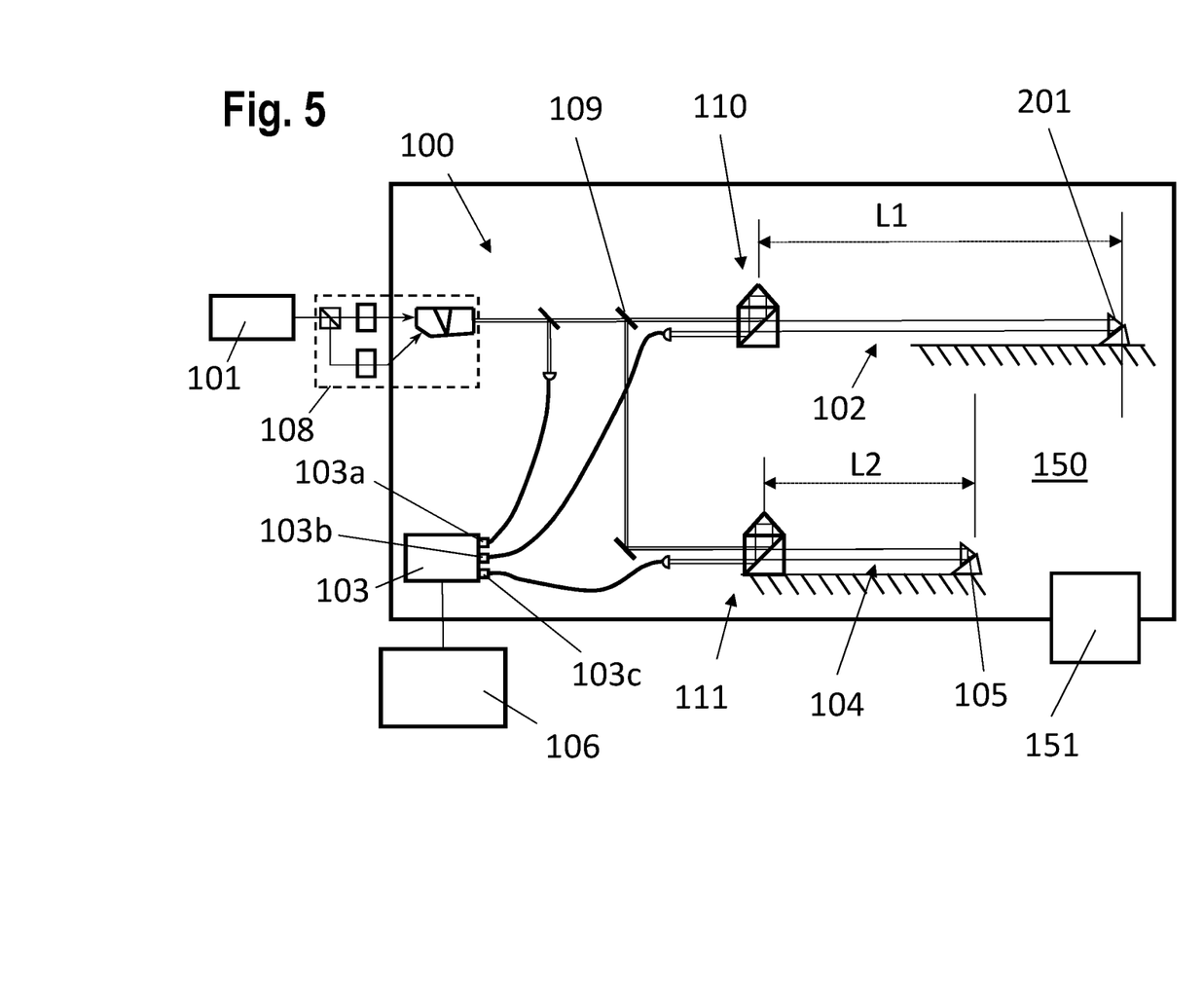
FIG. 5 depicts a second embodiment of an optical measurement system according to an embodiment of the invention.

FIG. 5 shows a second embodiment of interferometer system 100 configured to carry out a calibration method for cyclic errors of the interferometer system 100. The interferometer system 100 of the second embodiment is substantially the same as the embodiment shown in FIG. 4. The interferometer system 100 is a heterodyne interferometer system with a first optical axis 102 and a second optical axis 104. The first optical axis 102 has a first constant optical length L1 and the second optical axis 104 has a second constant optical length 104, whereby the first optical length 102 and the second optical length 104 are different.

A difference between the embodiment of FIG. 4 and the embodiment of FIG. 5 is that the laser source 101 of the embodiment of FIG. 5 is a laser source with fixed frequency, for example a stabilized HeNe laser, instead of the tunable laser source 107 of FIG. 4.

As explained with respect to the embodiment of FIG. 4, the cyclic errors of the first optical axis 102 and the second optical axis 104 can be determined by introducing a frequency change in the first and second measurement beams of the interferometer system 100. However, since the laser source 101 is a laser source with fixed frequency, this laser source 101 cannot be used to introduce a frequency change in the first and second measurement beams to obtain a wavelength change.

The relationship between frequency and wavelength is as follows.

$$f=\lambda/(c \cdot n),$$

wherein f is the frequency of the radiation beam, λ the wavelength, c the speed of light in vacuum and n the refractive index of the medium through which the respective measurement propagates. From this relationship it follows that the wavelength λ will change when the frequency f is changed.

An alternative method to introduce a wavelength change in the first and second measurement beams is to change the pressure within the space in which the first and second measurement beams propagate. The first optical axis 102 and the second optical axis 104 of the interferometer system 100 of FIG. 5 are arranged in a closed space 150 in which the pressure can be controlled by a pressure device 151. The pressure device 151 may control the pressure in the closed space 150 by introducing or taking out air or another medium into or out of the closed space 150.

Changing the pressure in the closed space 150 results in a variation of the refractive index of the medium in the closed space 150. From the relationship $f=\lambda/(c \cdot n)$, it follows that the change of the refractive index n also causes a change of the wavelength λ of the light propagating through the closed space.

In the interferometer system of FIG. 5, the calibration method comprises the following steps:
measuring a first measurement value along the first optical axis 102 using the first measurement beam and measuring a second measurement value along the second optical axis 104 using the second measurement beam,
changing a wavelength of the first measurement beam and the second measurement beam by changing the pressure in the closed space 150 from a first pressure level to a second pressure level,
measuring a further first measurement value along the first optical axis 102 using the first measurement beam with changed wavelength, and measuring a further second measurement value along the second optical axis 104 using the second measurement beam with changed wavelength.

Once these measurements are carried out a cyclic error of the optical measurement system can be determined on the basis of the first measurement value, the second measurement value, the further first measurement value and the further second measurement value, as explained with respect to the embodiment of FIG. 4.

An advantage of this method is that the cyclic errors can be determined for an interferometer system having fixed optical path lengths and a laser source with fixed frequency. Moreover, it is possible to measure cyclic errors of the interferometer system 100 for arbitrary non-smooth pressure variations in the closed space 150.

In the described method measurements at two pressure levels in the closed space 150 are carried out. In practice, multiple further measurements, for example hundreds or thousands of measurements, may be applied at different pressure levels, for example by taking multiple measurements while the pressure device 151 creates a pressure increase or decrease in a suitable pressure range.

Figure 6:
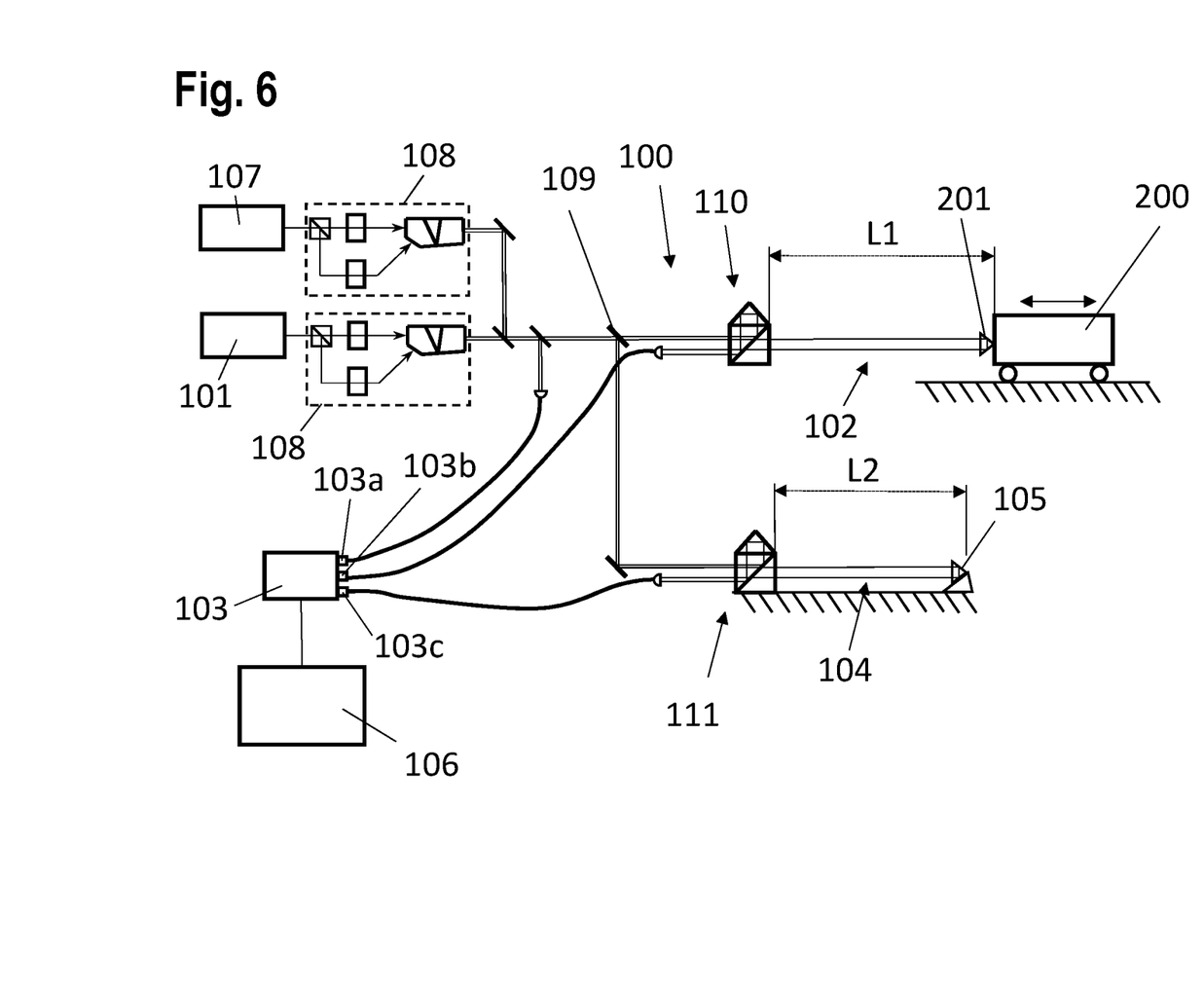
FIG. 6 depicts a third embodiment of an optical measurement system according to an embodiment of the invention.

FIG. 6 shows a third embodiment of an interferometer system 100 according to an embodiment of the invention. The interferometer system 100 is arranged to determine an absolute position of a movable object 200, for example a movable part of a projection system PS of a lithographic apparatus. The movable object 200 may also be a mask support or a substrate support of a lithographic apparatus.

The interferometer system 100 is a heterodyne interferometer system comprising a fixed frequency laser source 101. The fixed frequency laser source 101 is constructed to provide a radiation beam with a fixed frequency, and is for example a stabilized HeNe laser source.

The interferometer system 100 further comprises a tunable laser device 107. The tunable laser device 107 is configured to provide a radiation beam with a tunable light frequency.

The radiation beam of the tunable laser source 107 can be used to measure measurement values using a first measurement beam propagating along the first optical axis 102 and a second measurement beam propagating along the second optical axis 104, the first and second measurement beams originating from the radiation beam of the tunable laser source 107. Simultaneously, the radiation beam of the fixed frequency laser source 101 can be used to measure measurement values using a first further measurement beam propagating along the first optical axis 102 and a second further measurement beam propagating along the second optical axis 104, the first and second further measurement beams originating from the radiation beam of the fixed frequency laser source 101.

The combination of the fixed frequency laser source 101 and the tunable laser source 107 enables the determination of an absolute position of the movable object 200 by simultaneous measurement with measurement beams originating from the fixed frequency laser source 101 and from the tunable laser source 107, and subsequent changes in the position of the movable object 200 by measurement with measurement beams originating from the fixed frequency laser source 101. However, these measurements may be affected by cyclic errors of the respective optical axis 102, 104. Therefore, calibration of the first optical axis 102 and the second optical axis 104 for cyclic errors and compensating the operational measurement values for these cyclic errors is desirable.

Corresponding to the method described with respect to the embodiment of FIG. 4, a frequency change of the tunable laser 107 can be used to determine the cycle errors of the interferometer system 100, if the movable object 200 is held in a stable position. However, when the position of the movable object 200 changes during the calibration measurements, this will change the optical path length L1 of the first optical axis 102. The calibration measurements for the cyclic error will be affected by such change in the optical path length L1, and this may cause an incorrect calculation of the cyclic errors of the interferometer system 100.

To compensate the effects of the possible movements of the movable object 200, the fixed frequency laser source 101 can be used, simultaneously with the calibration measurements, to measure a change in position of the movable object laser source. The change in position as measured using further measurement beams originating from the radiation beam of the fixed frequency laser source 101, may for example be used as input for position control of the movable object 200 that is arranged to maintain the movable object in a stable position during the calibration measurements used for determining the cyclic errors of the interferometer system 100.

In an alternative embodiment, the processing unit 106 can be configured to correct the calibration measurement values for the movements of the movable object 200 during the calibration measurements to obtain corrected calibration measurement values. These corrected measurement values can subsequently be used to determine the cyclic error of the interferometer system.

In this way, the movements of the movable object 200 can be prevented or compensated during calibration measurements to calculate the cyclic error of the interferometer system 100.

Hereinabove, a calibration method to determine a cyclic error of an interferometer system was described. The method is based on the measurements along two optical axes having a different but stable optical length with a change in the wavelength of the measurement beams used for these measurements.

The wavelength of the measurement beams may be changed by tuning a frequency of a tunable laser source that provides the measurement beams, or by changing the pressure in the space through which the measurement beams propagate. In case one of the optical axes has a variable optical path length, the change in the optical path length during calibration measurements can be measured by additional measurements with a second laser source with fixed frequency. These additional measurements can be used for position control of a movable object in the respective optical axis to stabilize the optical path length, or the calibration measurements can be corrected on the basis of the additional measurements.

One of the advantages of this calibration method is that the calibration method is not restricted by requirement on the smoothness or minimum change rate of the wavelength between the respective calibration measurements, which allows the method to be more easily be applied in interferometer systems.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for calibration of an optical measurement system comprising a first optical axis associated with first interferometer optics and a second optical axis associated with second interferometer optics, wherein the first optical axis and second optical axis have a different optical path length, the method for the calibration comprising:
   measuring a first measurement phase value along the first optical axis using a first measurement beam and a first reference beam;
   measuring a second measurement phase value along the second optical axis using a second measurement beam and a second reference beam;
   changing a wavelength of the first measurement beam, the first reference beam, the second measurement beam, and the second reference beam;
   measuring a further first measurement phase value along the first optical axis using the first measurement beam with changed wavelength and the first reference beam with changed wavelength;
   measuring a further second measurement phase value along the second optical axis using the second measurement beam with changed wavelength and the second reference beam with changed wavelength;
   determining a cyclic error of the optical measurement system on the basis of the first measurement phase value, the second measurement phase value, the further first measurement phase value and the further second measurement phase value; and
   storing a corrective value based on the cyclic error.

2. The method of claim 1, wherein the method comprises repeating the steps of:
   changing the wavelength of the first measurement beam, the first reference beam, the second measurement beam, and the second reference beam;
   measuring a further first measurement phase value along the first optical axis using the first measurement beam with changed wavelength and the first reference beam with changed wavelength; and
   measuring a further second measurement phase value along the second optical axis using the second measurement beam with changed wavelength and the second reference beam with changed wavelength to obtain multiple further first measurement phase values and further second measurement phase values for different wavelengths to be used in the step of determining the cyclic error of the optical measurement system.

3. The method of claim 1, wherein changing the wavelength of the first measurement beam, changing the wavelength of the first reference beam, changing the wavelength of the second measurement beam and changing the wavelength of the second reference beam comprises tuning of a light frequency provided by a light source of the optical measurement system.

4. The method of claim 3, wherein the first optical axis and the second optical axis each have a fixed optical path length.

5. The method of claim 3, wherein:
at least the first optical axis has a variable optical path length,
the optical system comprises a second light source to provide a further first measurement beam with a fixed light frequency and a further second measurement beam with a fixed light frequency, and
the method for the calibration further comprises:
measuring a change in the variable optical path length on the basis of measurements using the further first measurement beam along the first optical axis and the further second measurement beam along the second optical axis; and
compensating for the change in the variable optical path length during the calibration steps.

6. The method of claim 5, wherein compensating for the change in the variable optical path length comprises controlling the position of a movable reflective element that defines the length of the variable optical path of the first optical axis to stabilize the first optical path length.

7. The method of claim 5, wherein compensating for the change in the variable optical path length comprises correcting the first measurement phase value and the further first measurement phase value for variations in the variable optical path length of the first optical axis.

8. The method of claim 1, wherein changing the wavelength of the first measurement beam and changing the wavelength of the second measurement beam comprises changing the refractive index of a medium in a measurement space in which the first optical axis and the second optical axis extend.

9. The method of claim 8, wherein changing the refractive index of the medium comprises changing the pressure in the measurement space.

10. An optical measurement system, comprising:
a light source to provide a first measurement beam, a first reference beam, a second measurement beam, and a second reference beam,
a first optical axis optically connected to the light source to receive the first measurement beam and the first reference beam;
a second optical axis optically connected to the light source to receive the second measurement beam and the second reference beam, wherein the first optical axis and second optical axis have a different optical path length;
first interferometer optics associated with the first optical axis;
second interferometer optics associated with the second optical axis;
a first detector associated with the first optical axis;
a second detector associated with the second optical axis; and
a processing unit connected to the first detector and the second detector,
wherein the optical measurement system is arranged to carry out a calibration method, comprising:
measuring with the first detector a first measurement phase value along the first optical axis using the first measurement beam and the first reference beam;
measuring with the second detector a second measurement phase value along the second optical axis using the second measurement beam and the second reference beam;
changing a wavelength of the first measurement beam, the first reference beam, the second measurement beam, and the second reference beam;
measuring with the first detector a further first measurement phase value along the first optical axis using the first measurement beam with changed wavelength and the first reference beam with changed wavelength;
measuring with the second detector a further second measurement phase value along the second optical axis using the second measurement beam with changed wavelength and the second reference beam with changed wavelength;
determining in the processing unit a cyclic error of the optical measurement system on the basis of the first measurement phase value, the second measurement phase value, the further first measurement phase value and the further second measurement phase value; and
storing a corrective value based on the cyclic error.

11. The optical measurement system of claim 10, wherein the optical measurement system is arranged to repeat the steps of:
changing the wavelength of the first measurement beam, the first reference beam, the second measurement beam and the second reference beam,
measuring a further first measurement phase value along the first optical axis using the first measurement beam with changed wavelength and the first reference beam with changed wavelength; and
measuring a further second measurement phase value along the second optical axis using the second measurement beam with changed wavelength and the second reference beam with changed wavelength, to obtain multiple further first measurement values and further second measurement phase values for different wavelengths to be used in the step of determining the cyclic error of the optical measurement system.

12. The optical measurement system of claim 10, wherein:
the light source is a tunable light source, and
changing the wavelength of the first measurement beam, changing the wavelength of the first reference beam, changing the wavelength of the second measurement beam, and changing the wavelength of the second reference beam comprises tuning of a light frequency provided by the light source of the optical measurement system.

13. The optical measurement system of claim 12, wherein the first optical axis and the second optical axis have a fixed optical path length.

14. The optical measurement system of claim 12, wherein:
at least the first optical axis has a variable optical path length,
the optical system comprises a second light source to provide a further first measurement beam with a fixed light frequency and a further second measurement beam with a fixed light frequency, and the optical measurement system is arranged to carry out during the calibration steps:

measuring a change in the variable optical path length on the basis of measurements using the further first measurement beam along the first optical axis and the further second measurement beam along the second optical axis, and compensating for a change in the variable optical path length during the calibration steps.

15. The optical measurement system of claim 14, wherein compensating for a change in the variable optical path length comprises controlling the position of a movable reflective element that defines the length of the variable optical path of the first optical axis to stabilize the first optical path length.

16. The optical measurement system of claim 14, wherein compensating for a change in the variable optical path length comprises correcting the first measurement phase value and the further first measurement phase value for variations in the variable optical path length of the first optical axis.

17. The optical measurement system of claim 10, further comprising:

a measurement space in which the first optical axis and the second optical axis extend, wherein changing the wavelength of the first measurement beam, changing the wavelength of the first reference beam, changing the wavelength of the second measurement beam, and changing the wavelength of the second reference beam comprises changing the refractive index of a medium in the measurement space in which the first optical axis and the second optical axis extend.

18. The optical measurement system of claim 17, wherein the measurement space is associated with a pressure device configured to change the pressure in the measurement space to change the refractive index of the medium in the measurement space.

19. The optical measurement system of claim 10, wherein the optical measurement system is a heterodyne interferometer system.

20. A lithographic apparatus comprising an optical measurement system comprising:

a light source to provide a first measurement beam, a first reference beam, a second measurement beam, and a second reference beam;

a first optical axis optically connected to the light source to receive the first measurement beam and the first reference beam;

a second optical axis optically connected to the light source to receive the second measurement beam and the second reference beam, wherein the first optical axis and second optical axis have a different optical path length;

first interferometer optics associated with the first optical axis;

second interferometer optics associated with the second optical axis;

a first detector associated with the first optical axis;

a second detector associated with the second optical axis; and a processing unit connected to the first detector and the second detector, wherein the optical measurement system is configured to carry out a calibration method, comprising:

measuring with the first detector a first measurement phase value along the first optical axis using the first measurement beam;

measuring with the second detector a second measurement phase value along the second optical axis using the second measurement beam;

changing a wavelength of the first measurement beam, the first reference beam, the second measurement beam, and the second reference beam;

measuring with the first detector a further first measurement phase value along the first optical axis using the first measurement beam with changed wavelength and the first reference beam with changed wavelength;

measuring with the second detector a further second measurement phase value along the second optical axis using the second measurement beam with changed wavelength and the second reference beam with changed wavelength;

determining in the processing unit a cyclic error of the optical measurement system on the basis of the first measurement phase value, the second measurement phase value, the further first measurement phase value and the further second measurement phase value; and storing a corrective value based on the cyclic error.

* * * * *